(12) United States Patent
Tsutsumi et al.

(10) Patent No.: US 7,227,211 B2
(45) Date of Patent: Jun. 5, 2007

(54) DECOUPLING CAPACITORS AND SEMICONDUCTOR INTEGRATED CIRCUIT

(75) Inventors: Masanori Tsutsumi, Souraku-gun (JP); Junichi Yano, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/003,384

(22) Filed: Dec. 6, 2004

(65) Prior Publication Data
US 2005/0122755 A1 Jun. 9, 2005

(30) Foreign Application Priority Data
Dec. 8, 2003 (JP) ............................. 2003-409173

(51) Int. Cl.
*H01L 29/94* (2006.01)
(52) U.S. Cl. ................ 257/296; 257/532; 257/E29.345
(58) Field of Classification Search ................ 257/288, 257/296, 297, 300, 312, 313, 379, 532, 210, 257/202, 204, 206, E27.034, E27.048, E29.342, 257/E29.345
See application file for complete search history.

(56) References Cited

U.S. PATENT DOCUMENTS

| | | | | |
|---|---|---|---|---|
| 4,791,316 A | * | 12/1988 | Winnerl et al. ............. | 327/545 |
| 5,703,806 A | * | 12/1997 | Puar et al. .................. | 365/181 |
| 5,883,423 A | * | 3/1999 | Patwa et al. ................ | 257/532 |
| 6,100,751 A | * | 8/2000 | De et al. .................... | 327/534 |
| 6,339,235 B1 | * | 1/2002 | Takata ........................ | 257/208 |
| 6,828,638 B2 | * | 12/2004 | Keshavarzi et al. ........ | 257/392 |
| 6,833,577 B2 | * | 12/2004 | Matsui et al. ............... | 257/300 |

FOREIGN PATENT DOCUMENTS

| | | |
|---|---|---|
| JP | 3105512 | 4/1991 |
| JP | 7245378 | 9/1995 |

\* cited by examiner

*Primary Examiner*—Minhloan Tran
*Assistant Examiner*—Benjamin Tzu-Hung Liu
(74) *Attorney, Agent, or Firm*—Steven, Davis, Miller & Mosher, LLP

(57) ABSTRACT

VSS 302 is provided to a gate portion 304 and VDD 301 is provided to a source portion 305 and a drain portion 306 of a MOS transistor which constitutes a decoupling capacitor, and a potential NWVDD 303 different from that provided to the source portion 305 and the drain portion 306 is provided to a substrate portion 307. If NWVDD 303 is set higher than VDD 301, a depletion layer 309 is spread, so that a leakage current can be reduced instead of reducing a capacitance of the decoupling capacitor. In addition, if NWVDD 303 is set lower than VDD 301 so as not to cause latchup, the depletion layer 309 is reduced, so that the capacitance of the decoupling capacitor can be increased. By changing the potential NWVDD 303 provided to the substrate portion 307, a capacitance value and a leakage current value of the decoupling capacitor can be controlled. Thereby making it possible to achieve a decoupling capacitor capable of controlling the capacitance value and the leakage current value and also having excellent response characteristics.

7 Claims, 15 Drawing Sheets

DECOUPLING CAPACITORS AND SEMICONDUCTOR INTEGRATED CIRCUIT

BACKGROUND OF THE INVENTION

1. Field of the Invention

The present invention relates to a decoupling capacitor and a semiconductor integrated circuit using the same.

2. Description of Related Art

In recent years, along with improvement in speed and advanced features of a digital circuit, an improvement in speed and a high-density integration of a semiconductor integrated circuit have been made progress. Power consumption of a chip has increased due to the improvement in speed and the high-density integration of the semiconductor integrated circuit and a supply voltage drop (IR-DROP) has posed a problem in connection with it, and there have arisen problems that switching speed of a transistor has been decreased due to a supply voltage drop, resulting in a decrease in operating frequency of a circuit, and noise margin has been decreased due to the supply voltage drop and mislatch of data or the like has been generated, resulting in a circuit malfunction. For that reason, in order to increase a speed of the semiconductor integrated circuit and improve stability of a circuit operation, in a high-speed semiconductor integrated circuit, there is taken a countermeasure that a decoupling capacitor with capacitance of not less than nanofarads is inserted between a power supply and a ground within the circuit and a current is supplied from the decoupling capacitor against an internal rapid peak current, thereby making it hard to generate a supply voltage drop.

As a method of forming the decoupling capacitor in the semiconductor integrated circuit, there are a method of using a gate oxide film of a transistor and a method of using an overlap capacitance of interconnections or the like. In the method of using a overlap capacitance of interconnections, the capacitance is formed with interconnections arranged in parallel and a response speed of the capacitance is high because of a small resistance, whereas in order to prevent a short circuit between the interconnections, it is necessary to increase a space between the interconnections (interconnection space), but since the interconnection space cannot be reduced, a capacitance value per unit area is small, thereby making it difficult to form a capacitor with a large capacitance. In the meantime, in the method of using a gate oxide film of a transistor, since the gate oxide film thickness is very thin, the capacitance value per unit area becomes large, so that it is possible to form a capacitor having a capacitance of nanofarads but there is a problem that a leakage current increases or reliability decreases due to transistor breakdown caused by ESD or the like. In FIG. 14, there is shown an example of a structure of a decoupling capacitor using a gate oxide film of a P-channel transistor. In FIG. 14, a gate portion 103 of the transistor is connected to VSS 102, and a source portion 104, a drain portion 105, and a substrate portion 106 are connected to VDD 101. Therefore, a capacitance is formed between a gate and a channel through the gate oxide film.

Moreover, with a microfabrication of the semiconductor integrated circuit, although a gate oxide film thickness of a transistor has become thin and a gate length of the transistor has become short, a supply voltage has not been reduced so as to be proportional to it, so that a leakage current has increased. There are three kinds of current which flow through a transistor, such as switching current, through current, and leakage current (FIG. 15). In FIG. 15, a switching current 201 is a current which is consumed for the transistor to drive an interconnection or to pull up and down a gate capacitance of the next stage, and a through current 202 is a current which flows from a P-channel transistor to an N-channel transistor, since both the P-channel transistor and the N-channel transistor are temporarily opened when an output signal changes. In addition, a leakage current 203 is a current which flows from a source to a drain, and from a gate to the drain and a substrate, and a current which always flows even when a circuit is not in operation.

The leakage current does not cause a problem so much in normal operation because of its very small value compared with the switching current or the through current. But when the circuit is not in operation, such as in a standby mode, a lower power dissipation is particularly required. Because neither the switching current nor the through current flows, but the leakage current flows, a reduction in the leakage current in the standby mode is required. When the decoupling capacitor of not less than nanofarads using the gate oxide film is arranged in a chip, the leakage current due to only the decoupling capacitor will possibly be milliamperes, and the more the decoupling capacitors are inserted therein for a countermeasure against a supply voltage drop, the more the leakage current increases, so a reduction in the leakage current of the decoupling capacitor is required. As a method of reducing the leakage current of the decoupling capacitor, there is a method of thickening the gate oxide film, and in that case, a reduction in capacitance per unit area due to the gate oxide film thickness being thicker, and a reduction in capacitance due to a decrease in a gate area of the decoupling capacitor since it is necessity to increase a space to a transistor of a logic cell due to a process factor or the like are caused, thereby making it difficult to ensure sufficient capacitance.

A cell structure of the decoupling capacitor constituted so that a leakage current may not flow in a standby mode is disclosed in Patent Literature 1. According to this technology, by controlling a potential provided to one electrode of the above decoupling capacitor using an inverter, in normal operation, the above decoupling capacitor is used as a capacitor by setting both electrodes thereof at different potentials, and in a standby mode, both electrodes of the decoupling capacitor are set at the same potential so that a capacitance is not generated, thereby making a leakage current not to flow.

A structure of the semiconductor integrated circuit for controlling a leakage current by controlling a substrate is also disclosed in Patent Literature 2. According to this technology, by applying a reverse bias voltage to a substrate in a standby mode, a threshold value of the transistor is increased, so that a drive current of the transistor is decreased, thereby reducing a leakage current.

It is recommended to refer to Japanese Laid-Open Patent Application Publication No. 7-245378 as Patent Literature 1, and the Japanese Patent Publication No. 3105512 as Patent Literature 2.

However, according to the conventional structures of the above decoupling capacitor, it will become such a structure that a resistance between the source and the drain of the transistor for controlling the potential of the electrode is inserted between a power supply of the decoupling capacitor and a ground, resulting in a structure where a capacitor and a resistance are connected in series. Since the resistance between the source and the drain of the transistor has been large, when using it as the decoupling capacitor in normal operation, there has been a problem that a response of the capacitance has become worse.

Moreover, according to the method of reducing the leakage current by controlling the substrate like prior art, a circuit operation has also become worse in attempting to reduce the leakage current of the decoupling capacitor, so that it has not been able to gradually change a leak current value and a capacitance value according to working speed.

SUMMARY OF THE INVENTION

The present invention is invented in order to solve such a problem in the prior art, and the object thereof is to provide a decoupling capacitor capable of controlling a capacitance value and a leakage current value and also having excellent response characteristics, and a semiconductor integrated circuit using the same.

According to a decoupling capacitor of a first aspect of the present invention, the decoupling capacitor comprises a MOS transistor which has source/drain regions of a second conductive type formed on a surface of a substrate region of a first conductive type, wherein a capacitance value of the decoupling capacitor is changed by changing a potential of the substrate region.

According to this configuration, by changing the potential of the substrate region, the capacitance value between a substrate and a channel of the transistor changes owing to a substrate bias effect, making it possible to change the capacitance value of the decoupling capacitor.

According to a decoupling capacitor of a second aspect of the present invention, in the decoupling capacitor of the first aspect, by gradually changing the potential of the substrate region, the capacitance value of the decoupling capacitor is gradually changed.

According to this configuration, by gradually changing the potential of the substrate region, the capacitance value between the substrate and the channel of the transistor can gradually be changed owing to the substrate bias effect, thereby making it possible to gradually control the capacitance value of the decoupling capacitor.

According to a decoupling capacitor of a third aspect of the present invention, the decoupling capacitor comprises a MOS transistor which has source/drain regions of a second conductive type formed on a surface of a substrate region of a first conductive type, wherein a leakage current value of the decoupling capacitor is changed by changing a potential of the substrate region.

According to this configuration, by changing the potential of the substrate region, a capacitance value between a substrate and a channel of the transistor changes owing to the substrate bias effect, thereby making it possible to change the leakage current value of the decoupling capacitor.

According to a decoupling capacitor of a fourth aspect of the present invention, in the decoupling capacitor of the third aspect, by gradually changing the potential of the substrate region, the leakage current value of the decoupling capacitor is gradually changed.

According to this configuration, by gradually changing the potential of the substrate region, a capacitance between the substrate and a channel the of transistor can gradually be changed owing to the substrate bias effect, thereby making it possible to gradually control the leakage current value of the decoupling capacitor.

According to a decoupling capacitor of a fifth aspect of the present invention, the decoupling capacitor comprises a MOS transistor which has source/drain regions of a second conductive type formed on a surface of a substrate region of a first conductive type, wherein a first interconnection connected to the substrate region and a second interconnection connected to source/drain regions of the MOS transistor are electrically isolated.

According to this configuration, different potentials can easily be provided to the source/drain regions of the transistor of the decoupling capacitor and the substrate region.

According to a decoupling capacitor of a sixth aspect of the present invention, in the decoupling capacitor of the fifth aspect, different potentials are provided to the first interconnection and the second interconnection.

According to this configuration, the different potentials can be provided to the source/drain regions of the transistor of the decoupling capacitor and the substrate region, thereby making it possible to reduce a leakage current owing to the substrate bias effect.

According to a decoupling capacitor of a seventh aspect of the present invention, in the decoupling capacitor of the fifth aspect, the potential provided to the first interconnection is changed by a control signal.

According to this configuration, a substrate potential (potential of the substrate region) of the decoupling capacitor changes according to the control signal, thereby making it possible to control a leakage current value and a capacitance value of the decoupling capacitor.

According to a semiconductor integrated circuit of an eighth aspect of the present invention, the semiconductor integrated circuit comprises: a plurality of logic cells for constituting a logic comprising a MOS transistor which has source/drain regions of a second conductive type formed on a surface of a first substrate region of a first conductive type, and a MOS transistor which has source/drain regions of a first conductivity type formed on a surface of a second substrate region of the second conductive type, respectively; and a decoupling capacitor comprising a MOS transistor which has source/drain regions of the second conductive type formed on a surface of a third substrate region of the first conductive type, wherein an interconnection for providing a potential to the third substrate region of the decoupling capacitor and an interconnection for providing a potential to the source/drain regions of the MOS transistor of the decoupling capacitor are electrically isolated.

According to this configuration, a substrate potential of the decoupling capacitor can be controlled independently of the logic cell.

According to a semiconductor integrated circuit of a ninth aspect of the present invention, in the semiconductor integrated circuit of the eighth aspect, the third substrate region is electrically isolated from the first substrate region.

According to this configuration, a potential different from a substrate potential of another logic cell can be provided to the decoupling capacitor as the substrate potential.

According to a semiconductor integrated circuit of a 10th aspect of the present invention, in the semiconductor integrated circuit of the eighth aspect, a potential different from that provided to the first substrate region is provided to the third substrate region.

According to this configuration, a potential different from the substrate potential of another logic cell can be provided to the decoupling capacitor as the substrate potential, and a leakage current of the decoupling capacitor can be changed without affecting working speed of the logic cell.

According to a semiconductor integrated circuit of an 11th aspect of the present invention, in the semiconductor integrated circuit of the eighth aspect, an interconnection for providing a potential to the first substrate region of the logic cells and an interconnection for providing a potential to the source region of the MOS transistor which has source/drain regions of the second conductive type of the logic cell are electrically isolated, and the potential provided to the third substrate region of the decoupling capacitor and the potential provided to the first substrate region of the logic cell are controlled independently.

According to this configuration, a potential different from the substrate potential of another logic cell can be provided to the decoupling capacitor as the substrate potential, and a leakage current value of the logic cell and a leakage current value of the decoupling capacitor can be controlled independently.

According to a semiconductor integrated circuit of a 12th aspect of the present invention, in the semiconductor integrated circuit of the eighth aspect, the logic cell is placed in a plurality of cell rows, and the decoupling capacitor is placed between the cell rows.

According to this configuration, substrate regions (well) of the decoupling capacitor and other logic cells can easily be separated.

According to a semiconductor integrated circuit of a 13th aspect of the present invention, in the semiconductor integrated circuit of the eighth aspect, the logic cell is placed in a plurality of cell rows, the decoupling capacitor is placed in the cell row, and the third substrate region of the decoupling capacitor is apart from a boundary portion of the logic cell adjacent thereto.

According to this configuration, when arranging the decoupling capacitor in the logic cell row, other logic cells and the substrate regions (well) of the decoupling capacitor can easily be separated.

According to a semiconductor integrated circuit of a 14th aspect of the present invention, in the semiconductor integrated circuit of the eighth aspect, a potential of the third substrate region of the decoupling capacitor is controlled according to an operating frequency of the semiconductor integrated circuit.

According to this configuration, by providing a potential different from that provided to the source/drain regions to the decoupling capacitor as the substrate potential, the leakage current value and the capacitance value of the decoupling capacitor can be changed owing to the substrate bias effect, so that the leakage current value and the capacitance value of the decoupling capacitor can be changed according to the working speed.

According to a semiconductor integrated circuit of a 15th aspect of the present invention, in the semiconductor integrated circuit of the eighth aspect, the capacitance value of the decoupling capacitor is controlled according to the operating frequency of the semiconductor integrated circuit.

According to this configuration, by providing a potential different from that provided to the source/drain regions to the substrate potential of the decoupling capacitor, a capacitance of the decoupling capacitor can be changed owing to the substrate bias effect, so that it is possible to increase the capacitance in a high operating frequency and a large supply voltage drop, and to reduce the capacitance in a low operating frequency and a small supply voltage drop.

According to a semiconductor integrated circuit of a 16th aspect of the present invention, in the semiconductor integrated circuit of the eighth aspect, the potential of the third substrate region of the decoupling capacitor is controlled according to an operation mode of the semiconductor integrated circuit.

According to this configuration, by providing a potential different from that provided to the source/drain regions to the decoupling capacitor as the substrate potential, the capacitance value of the decoupling capacitor can be changed owing to the substrate bias effect, so that it is possible to increase the capacitance in an operation mode of a large supply voltage drop, and reduce the capacitance in an operation mode of a small supply voltage drop.

According to a semiconductor integrated circuit of a 17th aspect of the present invention, in the semiconductor integrated circuit of the eighth aspect, the capacitance value of the decoupling capacitor is controlled according to an operation mode of the semiconductor integrated circuit.

According to this configuration, by providing a potential different from that provided to the source/drain regions to the decoupling capacitor as the substrate potential, the leakage current value and the capacitance value of the decoupling capacitor can be changed owing to the substrate bias effect, so that it is possible to increase the capacitance in an operation mode of a large supply voltage drop, and reduce the capacitance in an operation mode of a small supply voltage drop.

According to a semiconductor integrated circuit of an 18th aspect of the present invention, in the semiconductor integrated circuit of the eighth aspect, it further comprises a plurality of functional blocks comprising a group of the logic cells, wherein the decoupling capacitor is arranged in each of the functional blocks, and the potential of the third substrate region of the decoupling capacitor is controlled for every functional block according to an operation mode of the semiconductor integrated circuit.

According to this configuration, by providing a potential different from that provided to the source/drain regions to the decoupling capacitor as the substrate potential, the leakage current value and the capacitance value of the decoupling capacitor can be changed owing to the substrate bias effect, so that it is possible to increase the capacitance of an internal decoupling capacitor for a functional block with a large supply voltage drop, and reduce the capacitance of the internal decoupling capacitor for a functional block with a small supply voltage drop according to an operation mode.

According to a semiconductor integrated circuit of a 19th aspect of the present invention, in the semiconductor integrated circuit of the eighth aspect, it further comprises a plurality of blocks comprising a group of the logic cells, wherein the decoupling capacitor is placed among the blocks.

According to this configuration, the leakage current value and the capacitance value of the decoupling capacitor arranged between blocks can also be changed.

According to a semiconductor integrated circuit of a 20th aspect of the present invention, in the semiconductor integrated circuit of the 19th aspect, it further comprises a plurality of decoupling capacitors placed among the blocks, wherein respective substrate potentials of the decoupling capacitors are controlled independently.

According to this configuration, the leakage current value and the capacitance value of the decoupling capacitor arranged between the blocks can be controlled independently, and it is possible to increase the capacitance of the decoupling capacitor arranged near a functional block with a large supply voltage effect, and reduce the capacitance of the decoupling capacitor arranged near a functional block with a small supply voltage effect.

According to a semiconductor integrated circuit of a 21st aspect of the present invention, in the semiconductor integrated circuit of the 20th aspect, the decoupling capacitor is arranged also in each of the blocks, and a potential of the third substrate region of at least one decoupling capacitor among a plurality of decoupling capacitors arranged between the blocks is controlled in conjunction with a control of a potential of the third substrate region of a decoupling capacitor arranged in either of the blocks.

According to this configuration, by achieving a commonality of a control of the substrate potential of the decoupling capacitor between the blocks and a control of the substrate potential of the decoupling capacitor in the block according to an operation mode or the like, the capacitance value of the decoupling capacitor between the blocks can be changed in conjunction with that in the block according to an operation mode or the like.

DETAILED DESCRIPTION OF THE PREFERRED EMBODIMENTS

Hereafter, description will be made of embodiments of the present invention based on the drawings.

Figure 1:
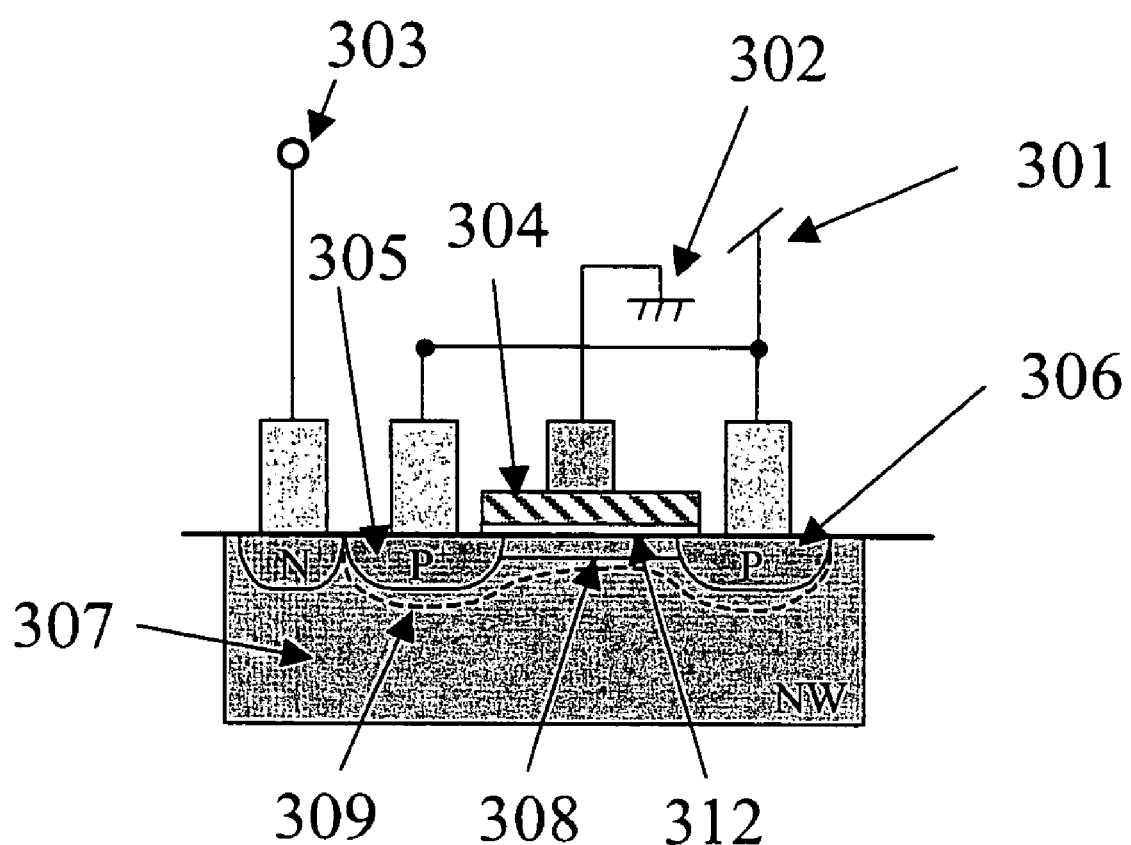
FIG. 1 is a structural drawing of a decoupling capacitor using a P-channel transistor of an embodiment of the present invention.

FIG. 1 shows a structure of a decoupling capacitor in accordance with the present invention, and reference numeral 304 represents a gate portion (gate electrode); reference numerals 305 and 306, a source portion (source region) and a drain portion (drain region) of P type, respectively; reference numeral 307, a substrate portion composed of an N-well (NW); reference numeral 308, a channel portion; and reference numeral 312, a gate oxide film. This decoupling capacitor is composed of a P-channel MOS transistor formed in an N-well (NW), and has structure of providing VSS 302, VDD 301, and another potential NWVDD 303 different from VDD 301 to the gate portion 304, the source portion 305 and the drain portion 306, and the substrate portion 307, respectively. Herein, if the potential provided to NWVDD 303 is set higher than VDD 301, a depletion layer 309 generated in a channel portion 308 from the source portion 305 and the drain portion 306 is spread, so that a PN junction capacitance between source/drain regions and a substrate (NW) is reduced. Incidentally, one power supply potential at a higher voltage supplied to a semiconductor integrated circuit in which this decoupling capacitor is embedded represents VDD, and the other power supply potential at a lower voltage represents VSS (ground potential). In addition, NWVDD represents a substrate potential of the decoupling capacitor, and is a potential provided to the N-well (NW) in which the P-channel transistor composing the decoupling capacitor is formed.

Figure 2:
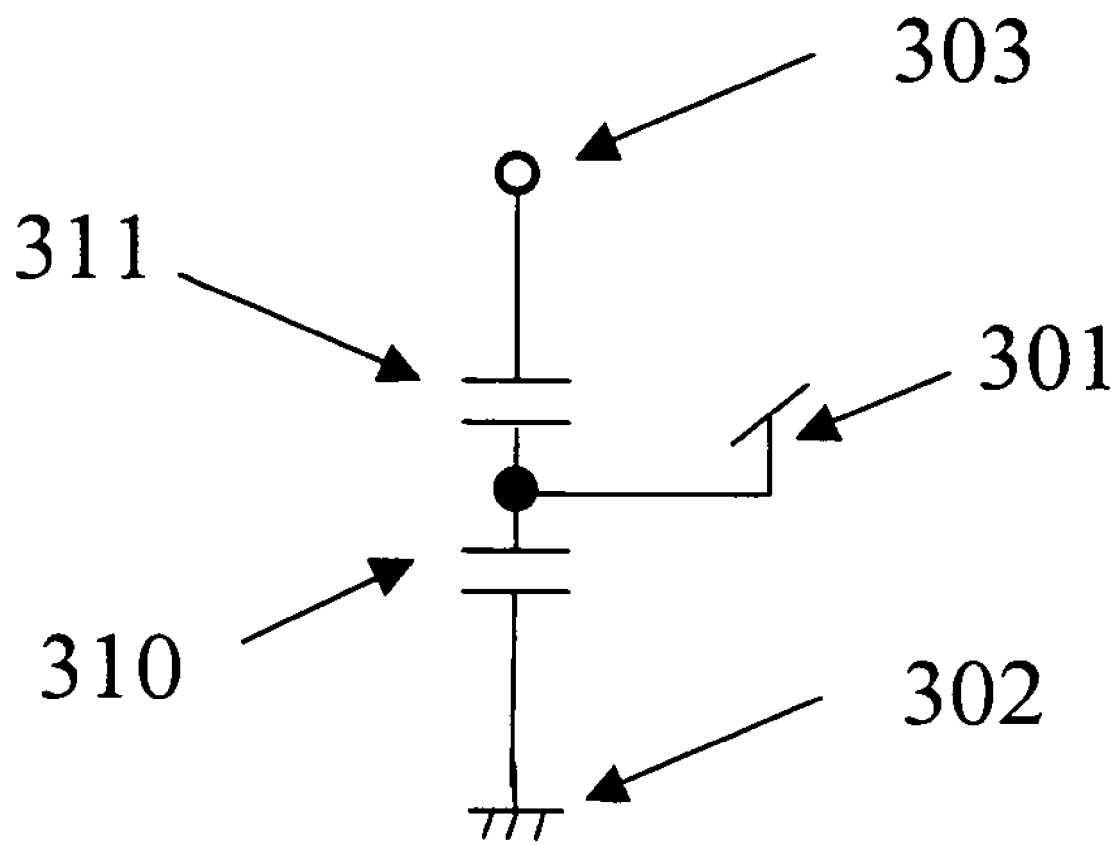
FIG. 2 is a block diagram of a capacitance of the decoupling capacitor in FIG. 1.

There is shown a structure of the capacitance of the decoupling capacitor in FIG. 2. Herein, reference numeral 301 represents VDD; reference numeral 302, VSS; reference numeral 303, NWVDD; reference numeral 310, a capacitance between VDD and VSS formed by the gate oxide film 312; and reference numeral 311, a capacitance between VDD and NWVDD formed by the depletion layer. Herein, by providing a potential higher than VDD 301 to NWVDD 303, the capacitance 311 between VDD and NWVDD is reduced owing to a substrate bias effect, so a leakage current which flows from the channel to the substrate decreases. In addition, Vt (threshold value) goes up owing to a back bias, a leakage current which flows from the gate to the source/drain of the transistor decreases. Therefore, by raising the potential provided to NWVDD 303 higher than VDD 301, the leakage current can be reduced, though the capacitance of the decoupling capacitor is reduced. Meanwhile, if the potential provided to NWVDD 303 is set lower than VDD 301, the depletion layer 309 is reduced, resulting in an increase in a capacitance between VDD and NWVDD. Herein if a forward bias is increased, latchup will be caused and a large current will flow through the transistor. Therefore, the potential provided to NWVDD 303 can be reduced a little bit lower than VDD 301, where latchup will not be caused, in order that the capacitance of the decoupling capacitor is increased.

Therefore, by changing the potential provided to NWVDD 303, a capacitance value and a leakage current value of the decoupling capacitor can be controlled.

Figure 3:
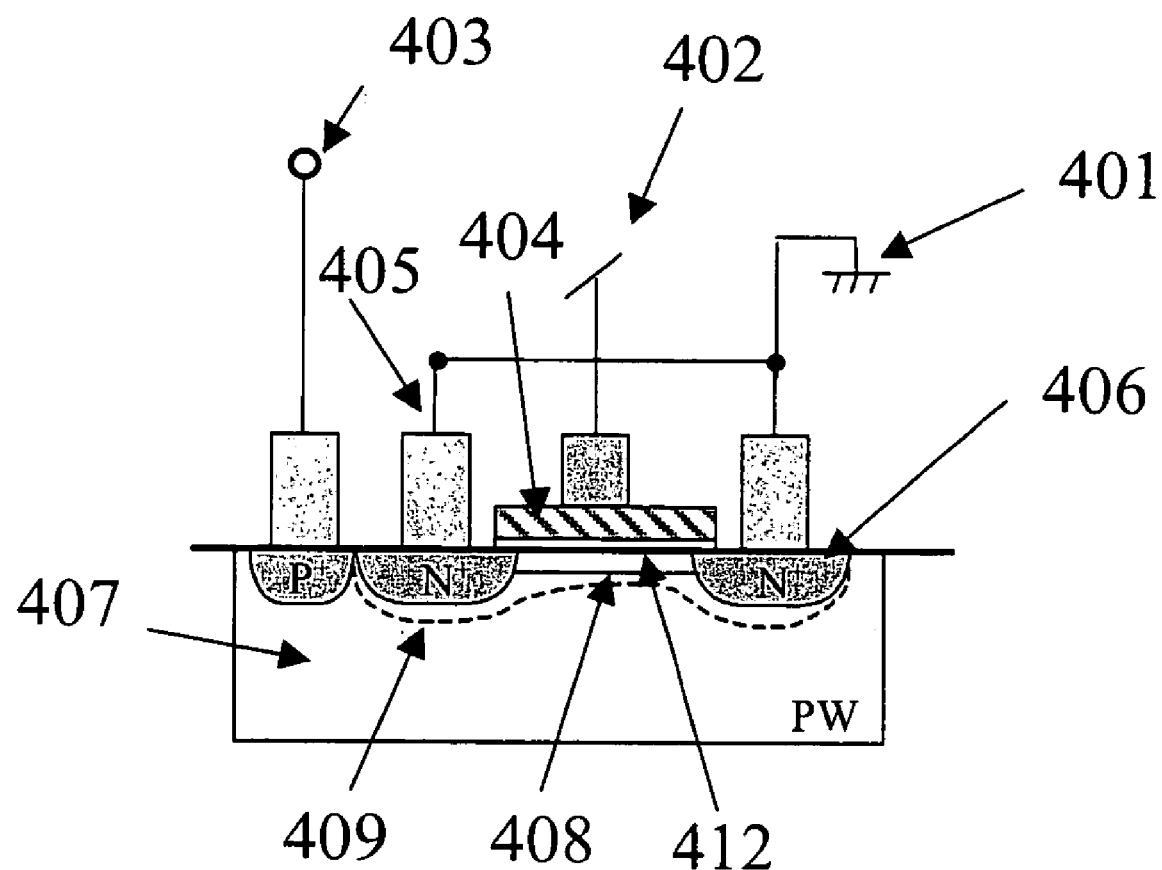
FIG. 3 is a structural drawing of a decoupling capacitor using an N-channel transistor of an embodiment of the present invention.

While description has been made of the decoupling capacitor composed of the P-channel MOS transistor in FIG. 1, as shown in FIG. 3, a decoupling capacitor composed of an N-channel MOS transistor may similarly be composed and controlled. In FIG. 3, reference numeral 404 represents a gate portion (gate electrode); reference numerals 405 and 406, a source portion (source region) and a drain portion (drain region) of N type, respectively; reference numeral 407, a substrate portion composed of an P-well (PW); reference numeral 408, a channel portion; and reference numeral 412, a gate oxide film. It is composed of such a structure that VDD 402, VSS 401, and another potential PWVSS 403 different from VSS 401 are provided to the gate portion 404, the source portion 405 and the drain portion 406 of the transistor, and the substrate portion 407, respectively. By providing a potential PWVSS 403 different from VSS to the substrate portion 407, a capacitance and a leakage current can be controlled also for the decoupling capacitor composed of the N-channel transistor. Herein, PWVSS is the substrate potential of the decoupling capacitor, and is a potential provided to the P-well (PW) in which the N-channel transistor composing the decoupling capacitor is formed.

Herein, by providing a potential lower than VSS 401 to PWVSS 403, a capacitance between VSS and PWVSS is reduced owing to the substrate bias effect, so that a leakage current which flows from the channel to the substrate decreases. Moreover, Vt (threshold value) goes up owing to the back bias, a leakage current which flows from the gate to the source/drain of the transistor decreases. Therefore, by lowering the potential provided to PWVSS 403 lower than VSS 401, the leakage current can be reduced, though the capacitance of decoupling capacitor is reduced. Meanwhile, if the potential provided to PWVSS 403 is set higher than VSS 401, the depletion layer 409 is reduced, resulting in an increase in the capacitance between VSS and PWVSS. Herein if a forward bias is increased, latchup will be caused and a large current will flow through the transistor. Therefore, the potential provided to PWVSS 403 can be increased a little bit higher than VSS, where latchup will not be caused, in order that the capacitance of the decoupling capacitor is increased.

In the case of composing the decoupling capacitor of the N-channel transistor and composing the semiconductor integrated circuit formed on a P-type wafer by a twin well process, because of the P-well short-circuits, the substrate potential of the decoupling capacitor can not be controlled. Therefore, in order to control the substrate (potential) of the decoupling capacitor for both of the N-channel transistor and the P-channel transistor, it is necessary to use a triple well process. And in a twin well process, it is necessary to use the decoupling capacitor composed of either of the P-channel transistor or the N-channel transistor.

Hereinafter, there are shown layout examples using the decoupling capacitor explained above.

Figure 4:
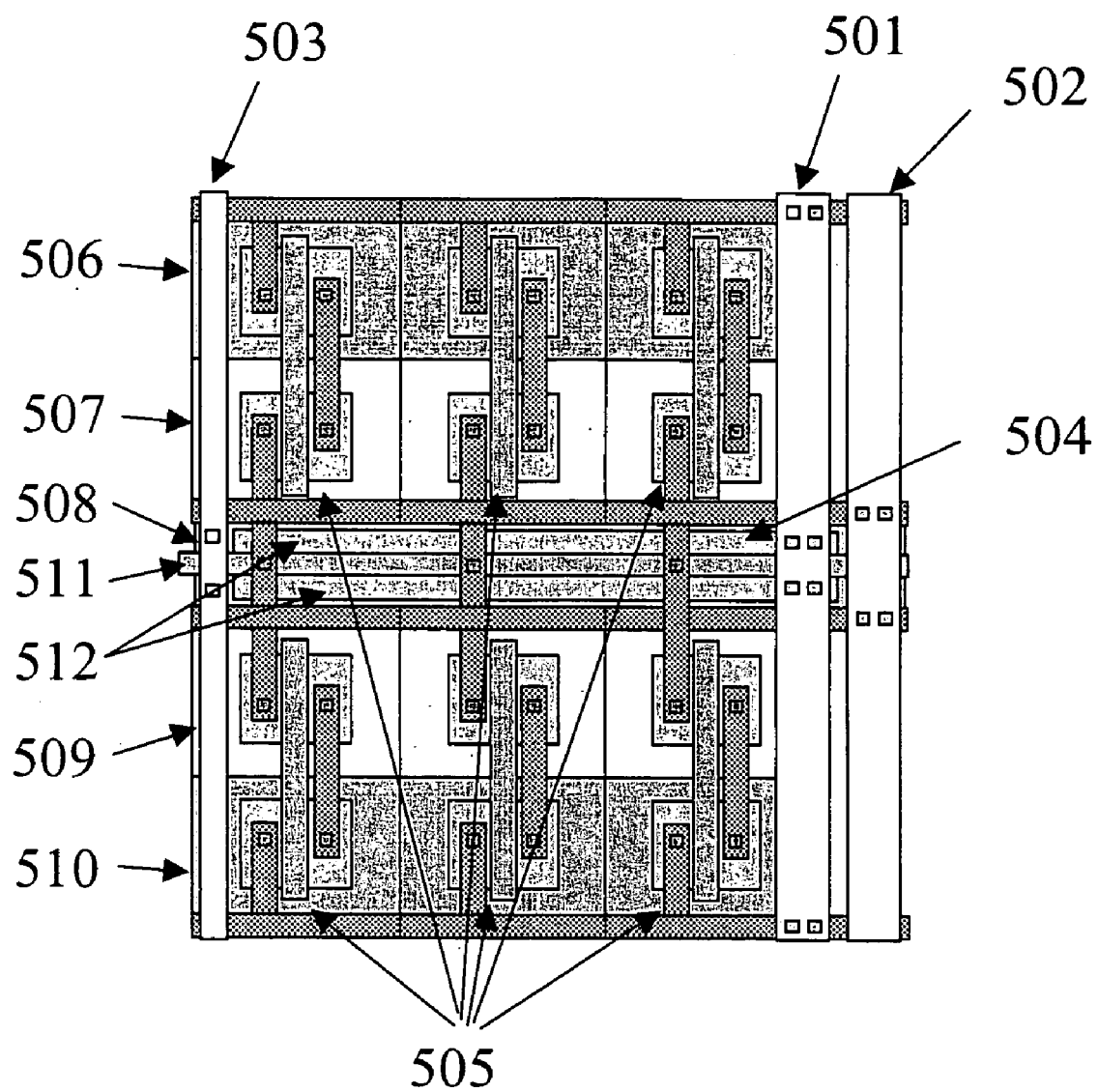
FIG. 4 is a view showing a layout example in the embodiment of the present invention.

First, FIG. 4 shows a layout example in which the above decoupling capacitor is arranged in a free region between cell rows. Herein, reference numeral 501 represents a VDD power supply strap; reference numeral 502, a VSS power supply strap; reference numeral 503, an NWVDD power supply strap; reference numeral 504, a decoupling capacitor composed of a P-channel transistor; reference numeral 505, logic cells; reference numerals 506, 508, and 510, N-wells; reference numerals 507 and 509, P-wells; reference numeral 511, a gate portion of the transistor which composes the decoupling capacitor 504; and reference numeral 512, source/drain portions of the transistor which composes the decoupling capacitor 504.

The gate portion 511, the source/drain portions 512, and the substrate portion (N-well 508) of the decoupling capacitor 504 are electrically connected to the VSS power supply strap 502, the VDD power supply strap 501, and the NWVDD power supply strap 503, respectively.

As for the logic cells 505, a P-well and an N-well are arranged in an upper row and a lower row in reverse order so that the P-wells 507 and 509 in the logic cells of the upper row and the lower row may face each other, and the decoupling capacitor 504 is arranged in the free region between the cell rows. For this reason, since the N-well 508 of the decoupling capacitor 504 will touch only to the P-wells 507 and 509 of the logic cells 505, the well of the logic cells 505 and the well of the decoupling capacitor 504 are electrically isolated. Therefore, by providing a potential different from that of the VDD power supply strap 501 to the NWVDD power supply strap 503, a substrate potential of the N-well 508 of the decoupling capacitor 504 can be provided independently of a substrate potential of the logic cells 505.

Figure 5:
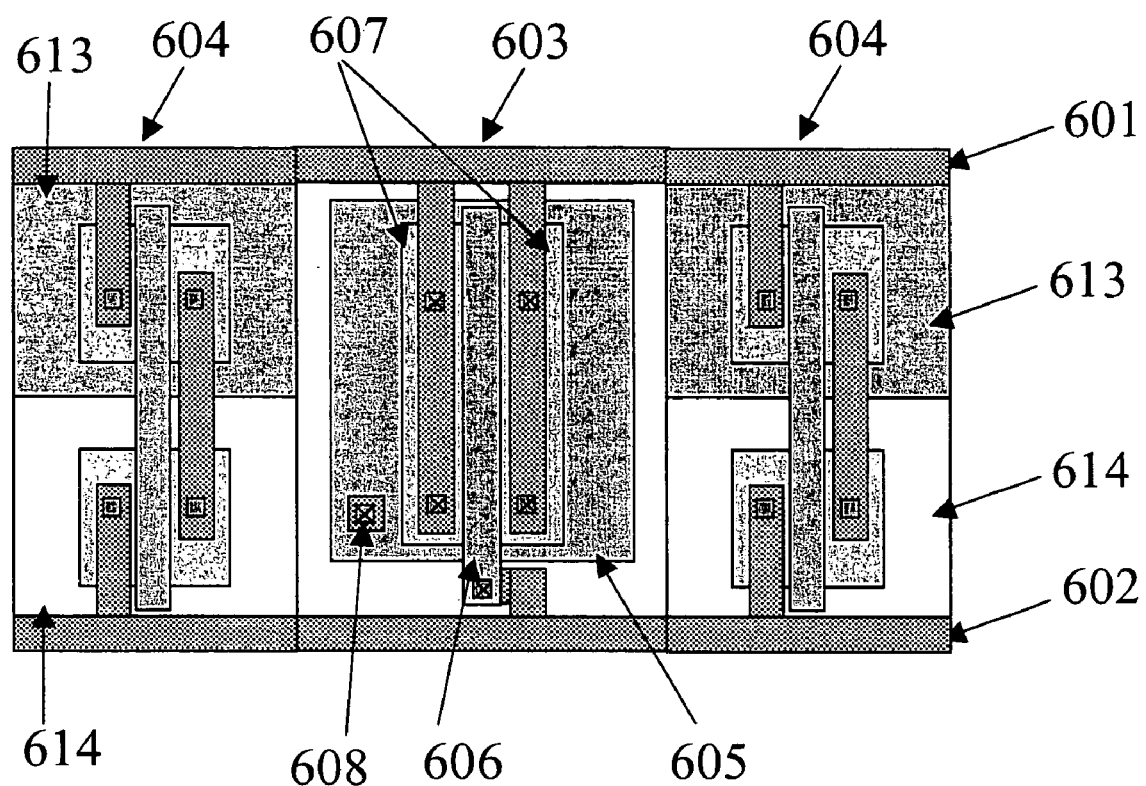
FIG. 5 is a view showing a layout example in the embodiment of the present invention.

Next, FIG. 5 shows a layout example in which the above decoupling capacitor is arranged at the free region in the cell row. Herein, reference numeral 601 represents VDD; reference numeral 602, VSS; reference numeral 603, a decoupling capacitor composed of a P-channel transistor; reference numeral 604, logic cells; reference numeral 605, an N-well to which a substrate potential of the decoupling capacitor is provided; reference numeral 613, N-wells of logic cells; and reference numeral 614, a P-well of the logic cells. The N-well 605 of the decoupling capacitor 603 is arranged apart from a boundary of the cell, a gate portion 606 and a source/drain portion 607 are electrically connected to VSS 602 and VDD 601, respectively, and a substrate potential of the transistor is supplied from a substrate power supply pin 608. Although the well of the logic cell is generally constituted so as to share the well with right and left cells, the N-well 605 of the decoupling capacitor is arranged apart from a boundary portion of the cell in this embodiment, so even when the logic cells are arranged on right and left sides of the decoupling capacitor, it results in a structure that the N-well of the decoupling capacitor and the well of the logic cells are separated.

Figure 6:
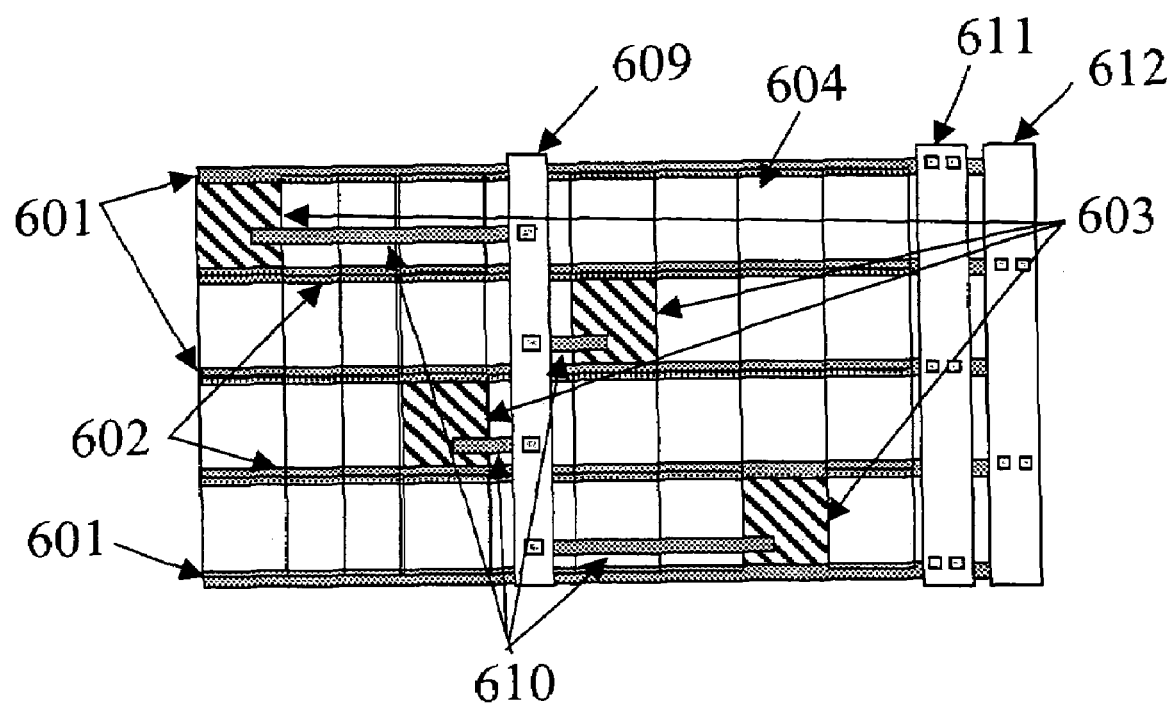
FIG. 6 is a view showing a layout example in the embodiment of the present invention.

FIG. 6 shows a layout example of a power supply interconnection in a semiconductor in which the decoupling capacitor of FIG. 5 is used. Herein, reference numerals 603, 609, 611 and 612 represent a decoupling capacitor, an NWVDD power supply strap, a VDD power supply strap, and a VSS power supply strap, respectively. Since the decoupling capacitors 603 are freely arranged in a free region in the cell rows, positions of the power supply pin for substrate 608 of the decoupling capacitors are not fixed, so that an interconnections of the substrate power supply pins 608 are difficult to be routed. For that, the NWVDD power supply straps 609 are located at a constant spacing in advance, and the NWVDD power supply strap 609 closest to the power supply pins for substrate 608 of each decoupling capacitors 603 are connected by substrate power supply lines 610, thereby making it possible to provide the potential to the power supply pins for substrate 608. In FIG. 6, the electrical connection is established in such a manner that the substrate power supply lines 610 are connected from the power supply pin for substrate 608 of each decoupling capacitors 603 to the NWVDD power supply strap 609, so that the potential is provided to the substrate of each decoupling capacitors 603. In this way, the decoupling capacitors 603 can be freely arranged at the free region in the cell rows, and as shown in FIG. 5, since the N-well 605 of each decoupling capacitors 603 is arranged apart from the boundary of the cell, the wells of the decoupling capacitors and the wells of the logic cells can be electrically isolated. Moreover, by providing the potential to the NWVDD power supply strap 609, it is possible to provide a potential different from that to the well of the logic cells 604 to the N-well 605 of each decoupling capacitors 603.

Figure 7:
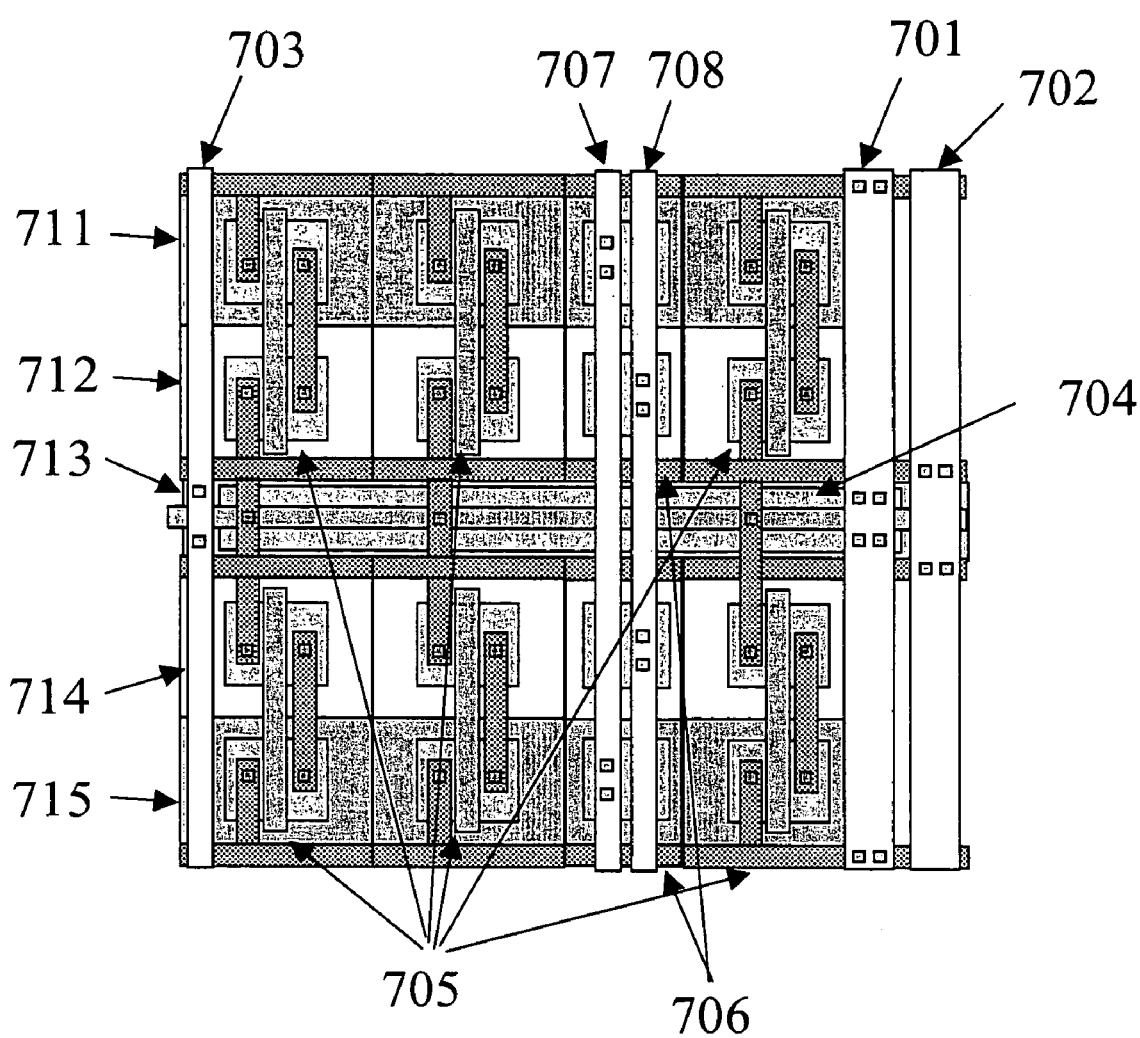
FIG. 7 is a view showing a layout example in the embodiment of the present invention.

In FIG. 4 and FIG. 6, although description has been made of the layout where the potential different from the power supply potential is provided only to the substrate of the decoupling capacitor, it is also possible to provide potentials different from the power supply potential to the decoupling capacitor and the logic cell, respectively. FIG. 7 shows a layout where potentials different from the power supply potential can be provided to the decoupling capacitor and the logic cell, respectively. Herein, reference numeral 701 represents a VDD power supply strap; reference numeral 702, a VSS power supply strap; reference numeral 703, an NWVDD power supply strap for decoupling capacitor; reference numeral 704, a decoupling capacitor composed of a P-channel transistor; reference numeral 705, logic cells; reference numeral 706, substrate potential cells; reference numeral 707, an NWVDD power supply strap for logic cells; and reference numeral 708, a PWVSS power supply strap for logic cells. Moreover, reference numerals 711 and 715 represent N-wells; reference numerals 712 and 714, P-wells; and reference numerals 713, an N-well composing a substrate portion of the decoupling capacitor 704. A gate portion, a source portion, a drain portion, and a substrate portion of the decoupling capacitor 704 are electrically connected to the VSS power supply strap 702, the VDD power supply strap 701, the VDD power supply strap 701, and the NWVDD power supply strap 703 for decoupling capacitor, respectively, and it is constituted in a manner similar to the decoupling capacitor 504 in FIG. 4.

The substrate potential cells 706 are arranged in cell rows, and in the substrate potential cells 706, the N-wells (711, 715) and the P-wells (712, 714) thereof are electrically connected to the NWVDD power supply strap 707 for logic cells and the PWVSS power supply strap 708 for logic cells, respectively. In the logic cells 705, potentials can be provided to a source region and the substrate portion of the transistor independently, and since wells of the substrate potential cells 706 are connected to that of the logic cell 705, by providing a potential to the wells of the substrate potential cells 706, the potential can be provided to the wells of all logic cells 705 in the same row.

Figure 8:
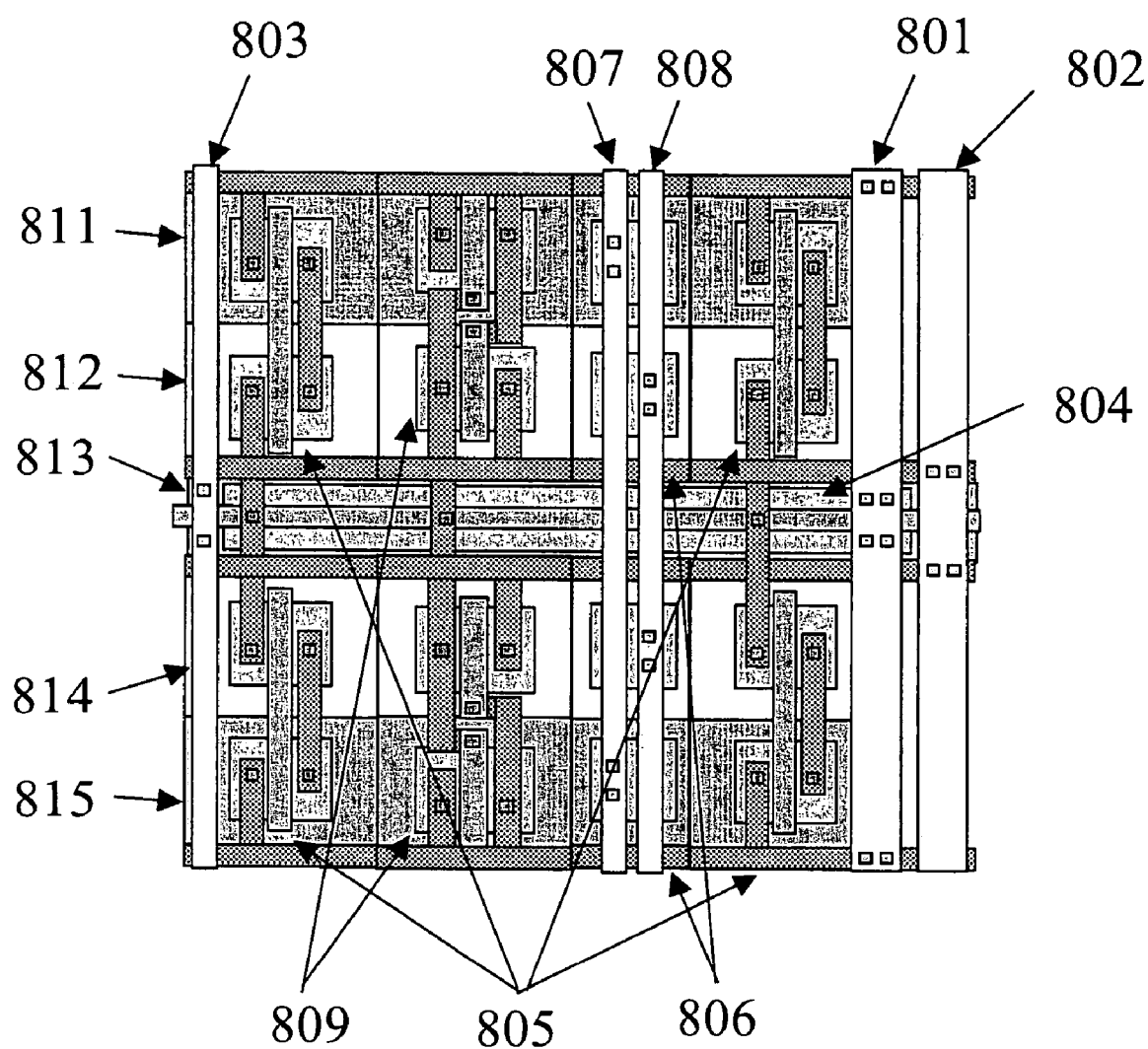
FIG. 8 is a view showing a layout example in the embodiment of the present invention.

In FIG. 7, although description has been made of the layout where the substrate potentials can independently be provided to the logic cells and the decoupling capacitors, after dividing the decoupling capacitors into two groups, such as a decoupling capacitor group 1 and a decoupling capacitor group 2, the substrate potential can also be independently provided to a block where the logic cells and the decoupling capacitor group 1 are grouped, and the decoupling capacitor group 2. FIG. 8 shows a layout configuration of this case. In FIG. 8, reference numeral 801 represents a VDD power supply strap; reference numeral 802, a VSS power supply strap; reference numeral 803, an NWVDD power supply strap for decoupling capacitor; reference numeral 804, a decoupling capacitor A arranged between cell rows; reference numeral 805, logic cells; reference numeral 806, substrate potential cells; reference numeral 807, an NWVDD power supply strap for logic cells; reference numeral 808, a PWVSS power supply strap for logic cells; reference numeral 809, a decoupling capacitors B arranged between the cell rows. In addition, reference numerals 811 and 815 represent N-wells; reference numerals 812 and 814, P-wells; reference numerals 813, an N-well composing a substrate portion of the decoupling capacitor A 804. A gate portion, a source portion, a drain portion, and a substrate portion of the decoupling capacitor A 804 are electrically connected to the VSS power supply strap 802, the VDD power supply strap 801, the VDD power supply strap 801, and the NWVDD power supply strap 803 for decoupling capacitor, respectively, and it is constituted in a manner similar to the decoupling capacitors 504 and 704 in FIG. 4 and FIG. 7, respectively. The substrate potential cells 806 are arranged in the cell row, in the substrate potential cells 806, the N-well (811, 815) and P-well (812, 814) are electrically connected to the NWVDD power supply strap for logic cells 807 and the PWVSS power supply strap for logic cells 808, respectively, and their structure are similar to those of the substrate potential cells 706 in FIG. 7.

The decoupling capacitors B 809 are arranged in the cell row, and have both of the N-well and the P-well similar to the logic cells 805, their wells are contacted to those of adjacent logic cells, the decoupling capacitor is constituted on each well, in the decoupling capacitors on the N-well (811, 815), a gate portion, a source portion, a drain portion, and a substrate portion thereof are electrically connected to the VSS power supply strap 802, the VDD power supply strap 801, the VDD power supply strap 801, and the NWVDD power supply strap 807 for logic cells, respectively, and in the decoupling capacitors on the P-well (812, 814), a gate portion, a source portion, a drain portion, and a substrate portion thereof are electrically connected to the VDD power supply strap 801, the VSS power supply strap 802, the VSS power supply strap 802, and the PWVSS power supply strap 808 for logic cells, respectively. For that reason, since the wells of the logic cells 805 and the decoupling capacitors B 809 are contacted to those of the substrate potential cells 806, by providing a potential to the wells of the substrate potential cells 806, the potential can be provided to the wells of all the logic cells 805 and decoupling capacitors B 809 in the same row. And a substrate potential can also be independently provided to a block where the logic cells 805 and the decoupling capacitors B809 are grouped, and the decoupling capacitor A 804, so that when arranging the decoupling capacitor between the cell rows, area damage for separating the wells can be suppressed.

In a chip, such as a microcontroller or the like, there are a sleep mode for completely stopping its operation, a low-speed operation mode for reducing only its operation frequency and the like other than a normal mode for executing an instruction. Since transistors may hardly operate in the sleep mode, there is almost no supply voltage drop, so that the decoupling capacitor is not required. Moreover, also in the low-speed operation mode, since the supply voltage drop is smaller than that in normal operation, the capacitance of the decoupling capacitor can be reduced. Moreover, in normal operation, since the supply voltage drop is large, the decoupling capacitors as many as possible are required. Therefore, according to the degree of necessity of the decoupling capacitor, in a high-speed operation, the capacitance is increased with increasing the leakage current, and in low-speed operation, the leakage value is reduced with reducing the capacitance, thereby making it possible to suppress power consumption of the chip and also stabilize operation of the chip.

Hereafter, in a semiconductor integrated circuit provided with the decoupling capacitor according to the embodiments of the present invention, description will be made of a configuration of controlling the same.

Figure 9:
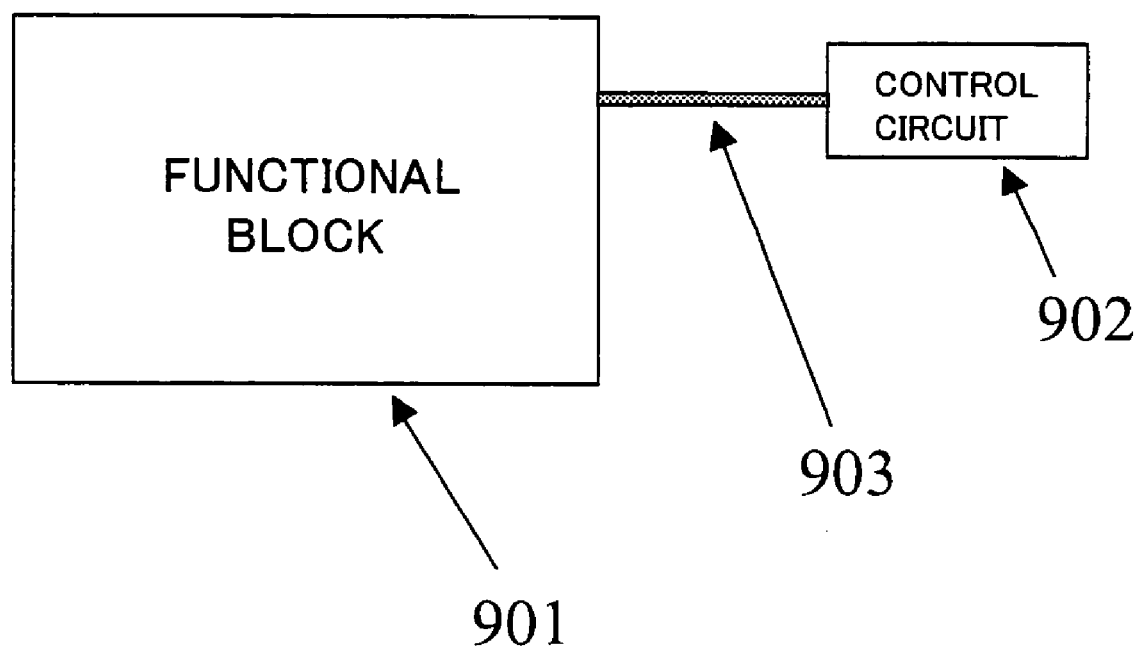
FIG. 9 is a view showing an example of a control method of the decoupling capacitor in the embodiment of the present invention.

First, FIG. 9 shows an example of a configuration of controlling the above decoupling capacitor. In FIG. 9, reference numeral 901 represents a functional block having the decoupling capacitor therein; reference numeral 902, a substrate control circuit; and reference numeral 903, a power supply line for substrate for supplying the substrate potential of the decoupling capacitor; and the substrate potential (either of NWVDD or PWVSS) supplied by the power supply line for substrate 903 is produced from the substrate control circuit 902, and is provided to the substrate portion of the decoupling capacitor in the functional block 901. Hereinafter, description will be made of an example where the decoupling capacitor is composed of the P-channel transistor and the NWVDD is supplied thereto as the substrate potential.

The substrate control circuit 902 receives operation mode signals and operating frequency signals, and when the supply voltage drop is large, such as in a high operating frequency, a normal operation or the like, supplies a potential the same as VDD or a potential which are lower than VDD but higher than a potential where latchup will be caused to the power supply line 903 for substrate as NWVDD, and increases the capacitance value of the decoupling capacitor. In addition, when the supply voltage drop is small, such as in a low operating frequency, a sleep mode or the like, it supplies a potential higher than VDD to the power supply line for substrate 903 as NWVDD, and reduces the capacitance value of the decoupling capacitor to reduce the leakage current. Moreover, the potential to be supplied can gradually be changed, and by decreasing the potential while in a large supply voltage drop and increasing the potential while in a small supply voltage drop, it is possible to stabilize operation of the circuit and also control the leakage current value flowing through the circuit.

In FIG. 9, although description has been made of a case where the circuit for controlling the substrate potential has existed in the semiconductor integrated circuit, the control circuit may exist outside the semiconductor integrated circuit, and the substrate potential may be controlled from an external.

Figure 10:
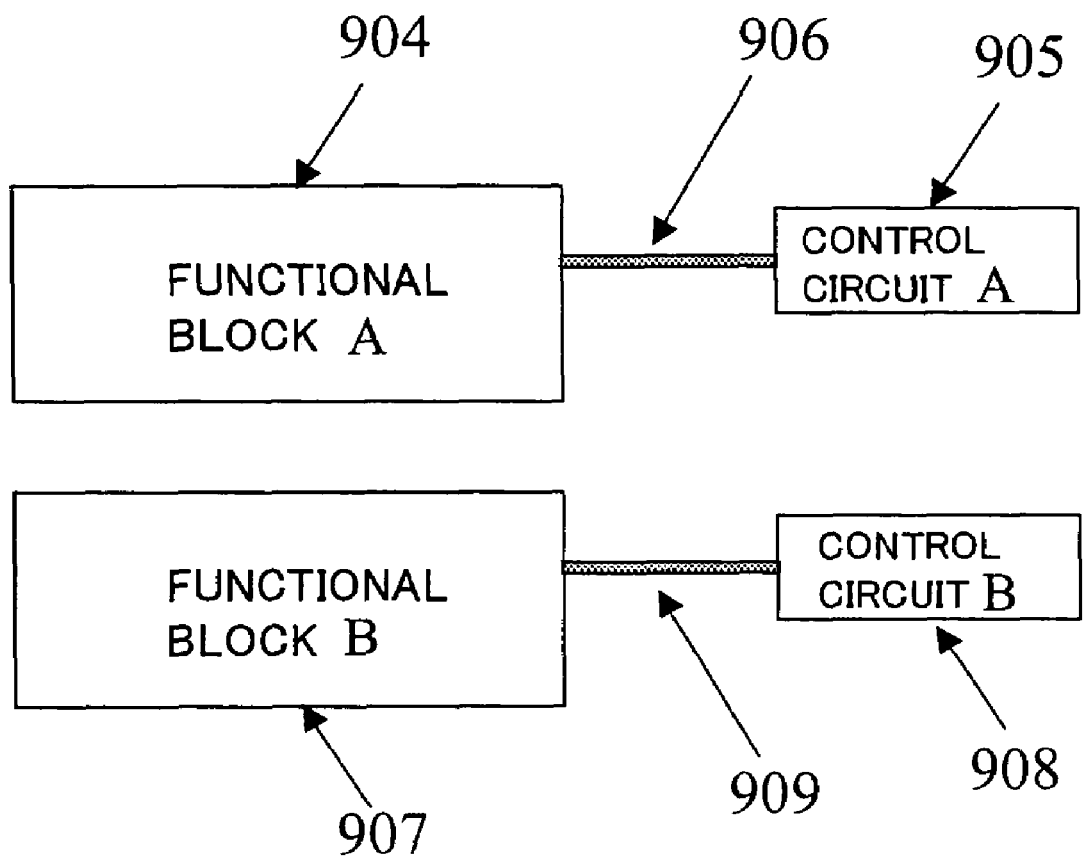
FIG. 10 is a view showing an example of a control method of the decoupling capacitor in the embodiment of the present invention.

Moreover, if there are circuits which does not operate simultaneously in the semiconductor integrated circuit, a leakage current of a circuit which does not operate can be reduced by controlling the substrate potential of its decoupling capacitor. FIG. 10 shows a configuration of this case. In FIG. 10, reference numeral 904 represents a functional block A having the decoupling capacitor therein; reference numeral 905, a substrate control circuit A; and reference numeral 906, a power supply line for substrate for supplying the substrate potential of the decoupling capacitor in the functional block A; and the substrate potential (either of NWVDD or PWVSS) supplied by the power supply line for substrate 906 is produced from the substrate control circuit A 905, and is provided to the substrate portion of the decoupling capacitor in the functional block A 904. Moreover, reference numeral 907 represents a functional block B having a decoupling capacitor therein; reference numeral 908, a substrate control circuit B; and reference numeral 909, a power supply line for substrate for supplying the substrate potential of the decoupling capacitor in the functional block B; and the substrate potential (either of NWVDD or PWVSS) supplied by the power supply line for substrate 909 is produced from the substrate control circuit B 908, and is provided to the substrate portion of the decoupling capacitor in the functional block B 907. Hereinafter, description will be made of an example of a case where the decoupling capacitors in the functional block A 904 and the functional block B 907 are composed of the P-channel transistors, and NWVDD is supplied as the substrate potential.

Herein, supposing that the functional block A 904 and the functional block B 907 do not simultaneously operate. When the functional block A 904 operates and the functional block B 907 does not operate, the substrate control circuit A 905 supplies a potential the same as VDD or a potential which are lower than VDD but higher than a potential where latchup will be caused to the power supply line 906 for substrate as NWVDD. And the substrate control circuit B 908 supplies a potential higher than VDD to the power supply line for substrate 909 as NWVDD. And when the functional block B 907 operates and the functional block A 904 does not operate, the substrate control circuit B 908 supplies a potential the same as VDD or a potential which are lower than VDD but higher than a potential where latchup will be caused to the power supply line 909 for substrate as NWVDD, and the substrate control circuit A 905 supplies a potential higher than VDD to the power supply line for substrate 906 as NWVDD, so that a leakage current value of the functional block which does not operate can be reduced.

In a chip with large scale circuits, since the degree of complexity of a design increases, there may be a case where the layout is made hierarchically. In that case, there are two regions, called an intra-block and an inter-block in the layout. Meanwhile, also when not laying out hierarchically, there may be a case where the layout is made by placing the circuit for certain function as a group, and also in that case, when considering a group for certain function as a block, there may be a case where regions, called an intra-block and an inter-block are created. When there is a region called the inter-block like this, the decoupling capacitor can be arranged in that portion, and by controlling the substrate potential in a manner similar to the decoupling capacitor in the block, the capacitance value and leakage current value can be controlled.

Figure 11:
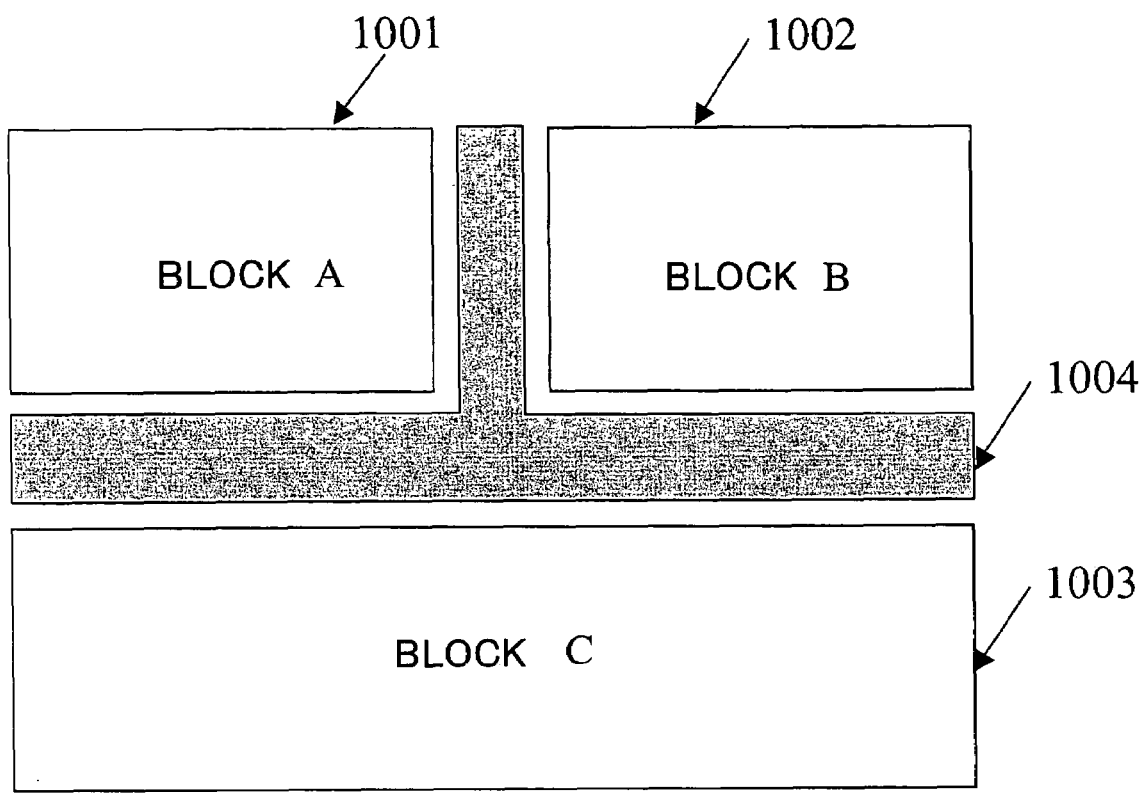
FIG. 11 is a view showing a layout example in the embodiment of the present invention.

FIG. 11 shows a layout example of a chip composed of a plurality of block regions and inter-block regions. FIG. 11 shows only a part of the chip layout. In FIG. 11, reference numerals 1001 through 1003 represent blocks, and reference numeral 1004 represents decoupling capacitors arranged in an inter-block region. Herein, since the decoupling capacitors 1004 are arranged between the blocks, in order to provide a potential to the well different from that of the block region, it is easy to electrically isolate the wells. By using another power supply as a substrate potential of the decoupling capacitors 1004 arranged between blocks, a capacitance value and a leakage current value of the decoupling capacitors 1004 between the blocks can be controlled.

Figure 12:
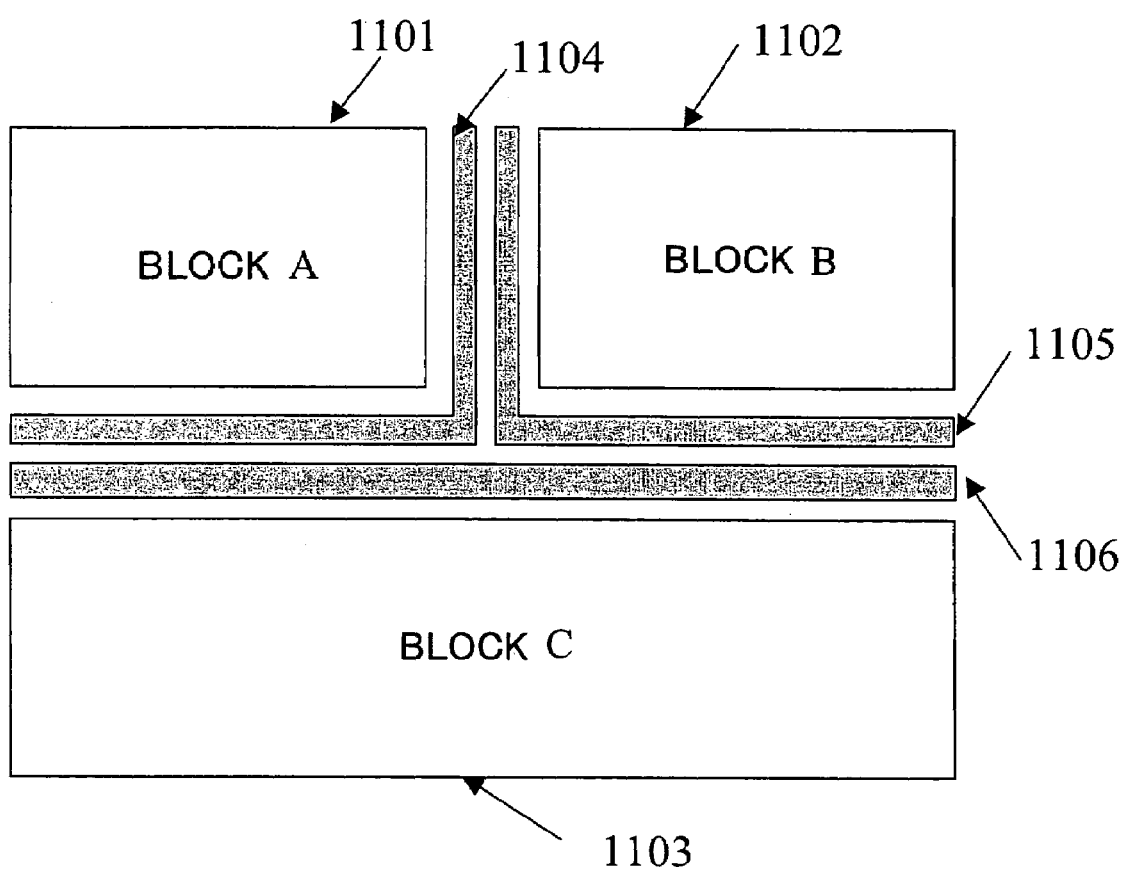
FIG. 12 is a view showing a layout example in the embodiment of the present invention.

In FIG. 11, although description has been made of the example where the decoupling capacitors has been arranged between the blocks as one group, it maybe arranged as a plurality of groups. FIG. 12 shows an example where the decoupling capacitors in an inter-block region are split into a plurality of groups. In FIG. 12, reference numerals 1101 through 1103 represent blocks, and reference numerals 1104 through 1106 represent decoupling capacitors arranged in an inter-block region. The decoupling capacitors A 1104, the decoupling capacitors B 1105, and the decoupling capacitors C 1106 are obtained by respectively grouping decoupling capacitors in the vicinity of the block A 1101, block B 1102, and block C 1103, respectively. In general, a decoupling capacitor which is arranged in the vicinity closer to a location where a supply voltage drop is generated has a higher supply voltage drop suppression effect, and since a larger capacitance value of the decoupling capacitor A 1104 maybe more effective for the supply voltage drop suppression effect for the block A 1101, when a supply voltage drop of the block A 1101 is large, the capacitance value of the decoupling capacitor A 1104 is increased to supress supply voltage drop effectively, whereas when the supply voltage drop of the block A 1101 is small, the capacitance value of the decoupling capacitors A 1104 is reduced to reduce a leakage current, thereby enabling to effectively use the decoupling capacitors.

In FIG. 12, although neighboring decoupling capacitors are grouped for every block, it is not necessary to make the number of the groups coincide with the number of blocks. For example, when the supply voltage drop of the block A 1101 is larger than that of another blocks, the decoupling capacitors A and the decoupling capacitors C may also be grouped into a group of decoupling capacitors, or the like. Moreover, although the capacitance value of the decoupling capacitors may be changed corresponding to a block in the vicinity of the group of the decoupling capacitor, it is not necessary to make it correspond to the neighboring block.

Figure 13:
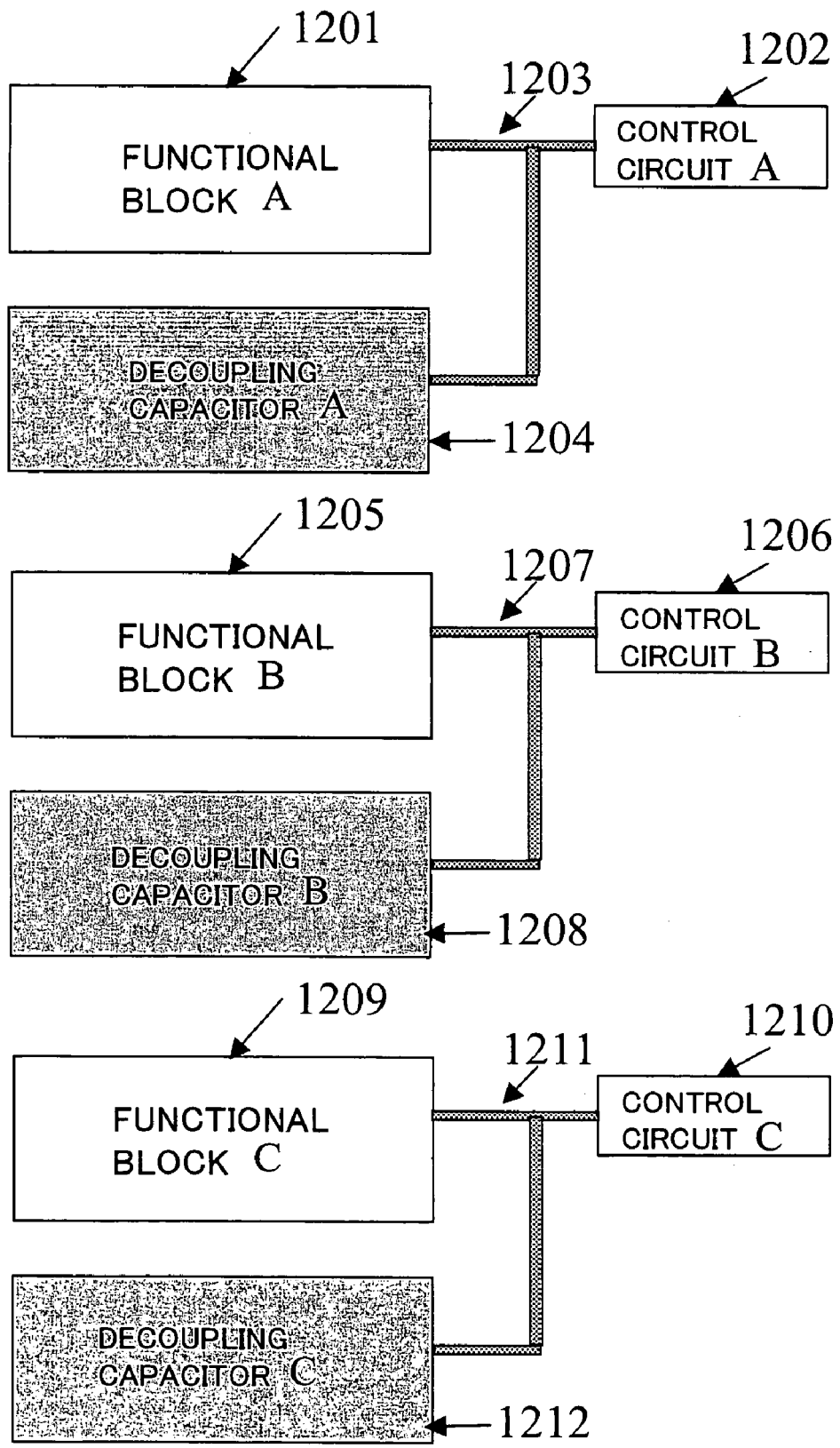
FIG. 13 is a view showing an example of a control method of the decoupling capacitor in the embodiment of the present invention.
Figure 14:
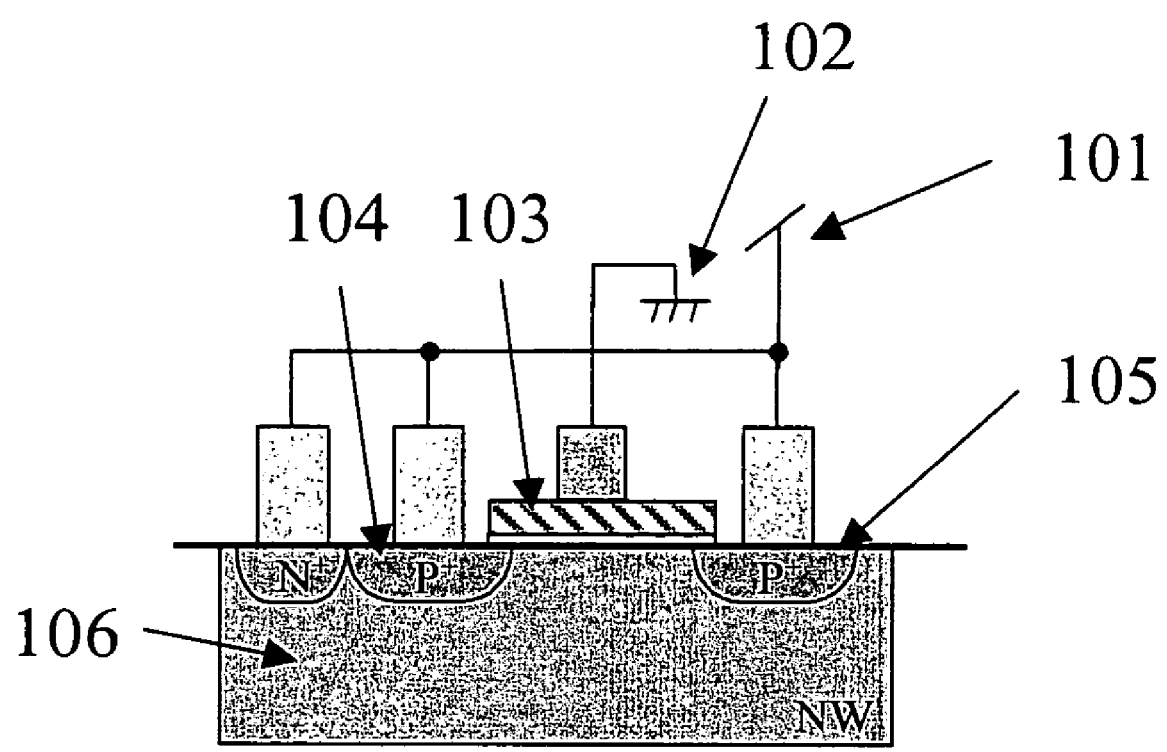
FIG. 14 is a structural drawing of the decoupling capacitor using a conventional gate oxide film.
Figure 15:
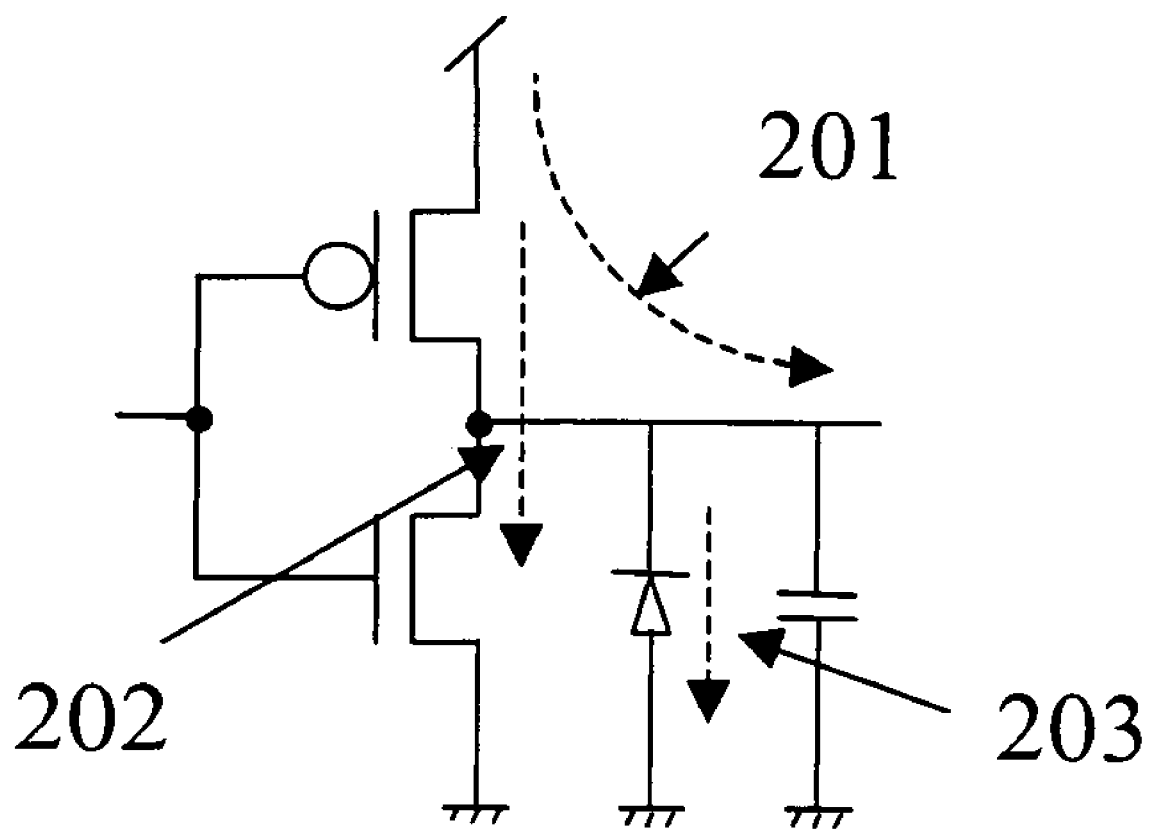
FIG. 15 is an explanatory diagram of a current flowing through a transistor.

Further, as shown in FIG. 12, by achieving a commonality of a control of a substrate potential of each decoupling capacitor arranged between the blocks with a control of a substrate potential of the decoupling capacitor arranged in each block, the decoupling capacitor can be used more effectively. FIG. 13 shows an example of a configuration of controlling the decoupling capacitor in this case. In FIG. 13, reference numerals 1201, 1205, and 1209 represent blocks A, B, and C having decoupling capacitors therein, respectively, reference numerals 1204, 1208, and 1212 represent decoupling capacitors A, B, and C arranged between the blocks, respectively, reference numerals 1202, 1206, and 1210 represent substrate control circuits A, B, and C, respectively, and reference numerals 1203, 1207, and 1211 represent power supply lines for substrate. The power supply line 1203 for substrate is provided from the substrate control circuit A 1202, and is connected to both of a substrate potential of the decoupling capacitor in the block A 1201 and a substrate potential of the decoupling capacitor A 1204 between the blocks. Herein, supposing that both of the decoupling capacitors arranged in the blocks and between the blocks are composed of the P-channel transistors, the substrate control circuit A 1202 receives operation mode signals and operating frequency signals, when the supply voltage drop is large, such as in a high operating frequency, a normal operation or the like, supplies a potential the same as VDD or a potential which are lower than VDD but higher than a potential where latchup will be caused to the power supply line 1203 for substrate to thereby increase capacitance values of the decoupling capacitors in the block A 1201 and the decoupling capacitors A 1204 between the blocks. Meanwhile, when the supply voltage drop is small, such as in a low operating frequency, a sleep mode or the like, it provides a potential higher than VDD to the power supply line 1203 for substrate, and reduces the capacitance values of the decoupling capacitors in the block A 1201 and the decoupling capacitors A 1204 between the blocks to thereby reduce a leakage current. In addition, the potential to be supplied can gradually be changed, and by decreasing the potential in a large supply voltage drop and increasing the potential in a small supply voltage drop, it is possible to stabilize operation of the circuit and also control the leakage current value flowing through the circuit. Herein, the capacitance value of the decoupling capacitors A 1204 between the blocks can be changed in conjunction with the capacitance value of the decoupling capacitors in the block A1201. Further, a control in a manner similar to these is performed to the functional block B 1205 and the decoupling capacitors B 1208 by the substrate control circuit B 1206, and also to the functional block C 1209 and the decoupling capacitors C 1212 by the substrate control circuit C 1210, so that it is possible to control the decoupling capacitors in the block and the decoupling capacitors between the blocks effectively.

In FIG. 13, although the power supply lines 1203, 1207, and 1211 for substrate are made in common, not the power supply lines for substrate but signal lines for control may be made in common, and the power supply lines for substrate may be separated into two, one is for the intra-block and the other is for the inter-block. In addition, although all controls of the decoupling capacitors in the block and between the blocks are made in common, only a part of combination thereof may be made in common.

Moreover, as shown in FIG. 11, even when decoupling capacitors 1004 are arranged between the blocks, the control of the substrate potential of the decoupling capacitors 1004 may be made in common to the control of the substrate potential of the decoupling capacitors arranged in either of the blocks A 1001, B 1002, and C 1003.

Incidentally, in the explanation of the control other than FIG. 3 so far, although description has mainly been made a case where the decoupling capacitors has been composed of the P-channel MOS transistors, in either examples after FIG. 4, the decoupling capacitors may also be composed of the N-channel MOS transistors.

According to the decoupling capacitor of the present invention, the capacitance value and the leakage current value thereof can be controlled, and it is useful to semiconductor integrated circuits or the like embedded this decoupling capacitor.

What is claimed is:

1. A semiconductor integrated circuit, comprising:
a plurality of logic cells for constituting a logic, each logic cell comprising a MOS transistor which has source and drain regions of a second conductivity type formed on a surface of a first substrate region of a first conductivity type, and a MOS transistor which has source and drain regions of the first conductivity type formed on a surface of a second substrate region of the second conductivity type respectively;
a first power supply interconnection for supplying a first power supply potential to said plurality of logic cells;
a second power supply interconnection for supplying a second power supply potential to said plurality of logic cells; and
a decoupling capacitor, disposed between said first power supply interconnection and said second power supply interconnection for preventing supply voltage drop of said plurality of logic cells, comprising a MOS transistor which has source and drain regions of the second conductivity type formed on a surface of a third substrate region of the first conductivity type and a gate region, wherein:
said first power supply potential is supplied to the source and drain regions of said MOS transistor of said decoupling capacitor and said second power supply potential is supplied to the gate region of said MOS transistor of said decoupling capacitor,
an interconnection for providing a potential to said third substrate region of said decoupling capacitor and an interconnection for providing a potential to the source and drain regions of said MOS transistor of said decoupling capacitor are electrically isolated and potentials of said third substrate region and said source and drain regions of said MOS transistor of said decoupling capacitor are controlled independently,
an interconnection for providing a potential to said first substrate region of said logic cells and an interconnection for providing a potential to the source region of said MOS transistor which has source and drain regions of the second conductive type of said logic cells are electrically isolated, and
the potential provided to said third substrate region of said decoupling capacitor and the potential provided to said first substrate region of said logic cells are controlled independently.

2. A semiconductor integrated circuit, comprising:
a plurality of logic cells for constituting a logic, each logic cell comprising a MOS transistor which has source and drain regions of a second conductivity type formed on a surface of a first substrate region of a first conductivity type, and a MOS transistor which has source and drain regions of the first conductivity type formed on a surface of a second substrate region of the second conductivity type respectively;
a first power supply interconnection for supplying a first power supply potential to said plurality of logic cells;
a second power supply interconnection for supplying a second power supply potential to said plurality of logic cells; and
a decoupling capacitor, disposed between said first power supply interconnection and said second power supply interconnection for preventing supply voltage drop of said plurality of logic cells, comprising a MOS transistor which has source and drain regions of the second conductivity type formed on a surface of a third substrate region of the first conductivity type and a gate region, wherein:
said first power supply potential is supplied to the source and drain regions of said MOS transistor of said decoupling capacitor and said second power supply potential is supplied to the gate region of said MOS transistor of said decoupling capacitor,
an interconnection for providing a potential to said third substrate region of said decoupling capacitor and an interconnection for providing a potential to the source and drain regions of said MOS transistor of said decoupling capacitor are electrically isolated and potentials of said third substrate region and said source and drain regions of said MOS transistor of said decoupling capacitor are controlled independently, and
said logic cells are placed in a plurality of cell rows, and said decoupling capacitor is placed between the cell rows.

3. A semiconductor integrated circuit, comprising:
a plurality of logic cells for constituting a logic, each logic cell comprising a MOS transistor which has source and drain regions of a second conductivity type formed on a surface of a first substrate region of a first conductivity type, and a MOS transistor which has source and drain regions of the first conductivity type formed on a surface of a second substrate region of the second conductivity type respectively;
a first power supply interconnection for supplying a first power supply potential to said plurality of logic cells;
a second power supply interconnection for supplying a second power supply potential to said plurality of logic cells; and
a decoupling capacitor, disposed between said first power supply interconnection and said second power supply interconnection for preventing supply voltage drop of said plurality of logic cells, comprising a MOS transistor which has source and drain regions of the second conductivity type formed on a surface of a third substrate region of the first conductivity type and a gate region, wherein:
said first power supply potential is supplied to the source and drain regions of said MOS transistor of said decoupling capacitor and said second power supply potential is supplied to the gate region of said MOS transistor of said decoupling capacitor,
an interconnection for providing a potential to said third substrate region of said decoupling capacitor and an interconnection for providing a potential to the source and drain regions of said MOS transistor of said decoupling capacitor are electrically isolated and potentials of said third substrate region and said source and drain regions of said MOS transistor of said decoupling capacitor are controlled independently, and
said logic cells are placed in a plurality of cell rows, said decoupling capacitor is placed in the cell rows and said third substrate region of said decoupling capacitor is apart from a boundary portion of said logic cells adjacent thereto.

4. A semiconductor integrated circuit, comprising:
a plurality of logic cells for constituting a logic, each logic cell comprising a MOS transistor which has source and drain regions of a second conductivity type formed on a surface of a first substrate region of a first conductivity type, and a MOS transistor which has source and drain regions of the first conductivity type formed on a surface of a second substrate region of the second conductivity type respectively;
a plurality of functional blocks comprising a group of said logic cells;
a first power supply interconnection for supplying a first power supply potential to said plurality of logic cells;
a second power supply interconnection for supplying a second power supply potential to said plurality of logic cells; and
a plurality of decoupling capacitors, each disposed between said first power supply interconnection and said second power supply interconnection for preventing supply voltage drop of said plurality of logic cells, each comprising a MOS transistor which has source and drain regions of the second conductivity type formed on a surface of a third substrate region of the first conductivity type and a gate region, wherein:
said first power supply potential is supplied to the source and drain regions of said MOS transistor of each of said decoupling capacitors and said second power supply potential is supplied to the gate region of said MOS transistor of each of said decoupling capacitors,
an interconnection for providing a potential to said third substrate region of each of said decoupling capacitors and an interconnection for providing a potential to the source and drain regions of said MOS transistor of each of said decoupling capacitors are electrically isolated and potentials of said third substrate region and said source and drain regions of said MOS transistor of each of said decoupling capacitors are controlled independently, and
one of said decoupling capacitors is arranged in each of said functional blocks, and the potential of said third substrate region of said one decoupling capacitor is controlled for every said functional block according to the operation mode of said semiconductor integrated circuit.

5. A semiconductor integrated circuit, comprising:
a plurality of logic cells for constituting a logic, each logic cell comprising a MOS transistor which has source and drain regions of a second conductivity type formed on a surface of a first substrate region of a first conductivity type, and a MOS transistor which has source and drain regions of the first conductivity type formed on a surface of a second substrate region of the second conductivity type respectively;
a plurality of blocks comprising a group of said logic cells;
a first power supply interconnection for supplying a first power supply potential to said plurality of logic cells;
a second power supply interconnection for supplying a second power supply potential to said plurality of logic cells; and
a decoupling capacitor, disposed between said first power supply interconnection and said second power supply interconnection for preventing supply voltage drop of said plurality of logic cells, comprising a MOS transistor which has source and drain regions of the second conductivity type formed on a surface of a third substrate region of the first conductivity type and a gate region, wherein:

said first power supply potential is supplied to the source and drain regions of said MOS transistor of said decoupling capacitor and said second power supply potential is supplied to the gate region of said MOS transistor of said decoupling capacitor, an interconnection for providing a potential to said third substrate region of said decoupling capacitor and an interconnection for providing a potential to the source and drain regions of said MOS transistor of said decoupling capacitor are electrically isolated and potentials of said third substrate region and said source and drain regions of said MOS transistor of said decoupling capacitor are controlled independently, and said decoupling capacitor is placed between said blocks.

6. The semiconductor integrated circuit according to claim 5, further comprising a plurality of said decoupling capacitor, wherein:

respective substrate potentials of said decoupling capacitors are controlled independently.

7. The semiconductor integrated circuit according to claim 6, wherein said plurality of decoupling capacitors are arranged in said blocks, and the potential of said third substrate region of the decoupling capacitor placed between said blocks is controlled in conjunction with a control of a potential of said third substrate region of a decoupling capacitor arranged in one of said blocks.

* * * * *